(12) United States Patent
Heber et al.

(10) Patent No.: US 6,824,597 B2
(45) Date of Patent: Nov. 30, 2004

(54) STABILIZERS FOR ELECTROLESS PLATING SOLUTIONS AND METHODS OF USE THEREOF

(75) Inventors: Jochen Heber, Neuenbuerg (DE); André Egli, Richterswit (CH)

(73) Assignee: Shipley Company, L.L.C., Marlborough, MA (US)

( * ) Notice: Subject to any disclaimer, the term of this patent is extended or adjusted under 35 U.S.C. 154(b) by 57 days.

(21) Appl. No.: 10/279,671

(22) Filed: Oct. 24, 2002

(65) Prior Publication Data

US 2003/0127015 A1 Jul. 10, 2003

Related U.S. Application Data

(60) Provisional application No. 60/335,145, filed on Oct. 24, 2001.

(51) Int. Cl.[7] .................. C23C 18/34; C23C 18/36; B05B 1/00
(52) U.S. Cl. .................. 106/1.22; 106/1.27; 427/443.1
(58) Field of Search ............... 106/1.22, 1.27; 427/443.1

(56) References Cited

U.S. PATENT DOCUMENTS

| | | | | |
|---|---|---|---|---|
| 2,762,723 A | * | 9/1956 | Talmey et al. | 427/438 |
| 3,420,680 A | * | 1/1969 | Gulla | 427/443.1 |
| 3,738,849 A | * | 6/1973 | Bellis | 106/1.27 |
| 4,483,711 A | * | 11/1984 | Harbulak et al. | 106/1.22 |
| 5,718,745 A | * | 2/1998 | Itoh et al. | 106/1.22 |
| 5,910,340 A | * | 6/1999 | Uchida et al. | 427/437 |
| 6,235,093 B1 | * | 5/2001 | Okuhama et al. | 106/1.18 |
| 6,273,943 B1 | * | 8/2001 | Chiba et al. | 106/1.22 |

* cited by examiner

Primary Examiner—Helene Klemanski
(74) Attorney, Agent, or Firm—John J. Piskorski

(57) ABSTRACT

Disclosed are electroless nickel plating composition including nickel, a reducing agent, a complexing agent, and an accelerator, wherein the accelerator is a mesoionic compound in an amount sufficient to accelerate the rate of deposition the composition.

20 Claims, 2 Drawing Sheets

STABILIZERS FOR ELECTROLESS PLATING SOLUTIONS AND METHODS OF USE THEREOF

CROSS-REFERENCE TO RELATED APPLICATIONS

This application claims the benefit under 35 U.S.C. §119 (e) of U.S. Provisional Application No. 60/335,145, filed Oct. 24, 2001, the entire contents of which are incorporated herein by reference.

BACKGROUND OF THE INVENTION

The present invention relates to electroless nickel plating solutions and in particular to stabilizers for electroless nickel plating solutions and methods of use thereof.

Electroless metal deposition solutions ("electroless plating solutions") deposit metal over a catalytically active surface by chemical reduction in the absence of an external electric circuit. Those solutions containing nickel are used in a wide range of industrial applications, particularly in the manufacture of electronic appliances and other articles. Nickel-boron and nickel-phosphorus coatings are recognized in the art for their hardness and associated wear-resistance. See, for example, U.S. Pat. Nos. 2,726,170; 3,045,334; 3,378,400; 3,738,849; 3,674,447; 3,432,338; and 5,019,163. Electroless nickel plating solutions are also used in the manufacture of electronic printed circuit boards, such solutions having been described, for example, in U.S. Pat. Nos. 2,690,401; 2,609,402; 2,762,723; 3,420,680; 3,515,564; and 4,467,067, all of which are incorporated herein by reference.

Typical electroless nickel plating solutions generally comprise a water-soluble nickel salt, a water-soluble alloying salt (if an alloy is present), a reducing agent, and a chelating or complexing agent. Additives may also be added in relatively low concentrations to enhance various characteristics of the solution of plated article. One continuing need with respect to electroless nickel plating solutions has been the need to increase the stability of the solution. It has been found, however, that in certain instances the addition of stabilizers to meet this need interferes with the formation of the nickel coating, in that during the formation of the nickel coating the accelerator co-deposits in the nickel. Some stabilizers are also known to cause discoloration of the deposit. For example, lead or cadmium can act as a stabilizer, but their addition can make the deposits shiny). Moreover, it is well known that stabilizers may cause step- or skip-plating. They can even prevent the initiation of the deposition completely if their concentration is too high. There accordingly remains a continuing need in the art for effective stabilizers for electroless nickel plating solutions that do not adversely affect the deposition process.

SUMMARY OF THE INVENTION

An electroless nickel plating composition comprises nickel, a reducing agent, a complexing agent, and an accelerator, wherein the accelerator is a mesoionic compound in an amount sufficient to accelerate the rate of deposition of the composition. The mesoionic compound may comprise sulfur. Most preferably, the mesoionic compound is a triazolium compound having the structure (I):

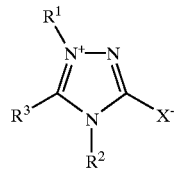

wherein
$R^1$ is a substituted or unsubstituted alkyl, alkenyl, thioalkoxy, or alkoxycarbonyl group having from 1 to 28 carbon atoms; a substituted or unsubstituted cycloalkyl group having from 3 to 28 carbon atoms; a substituted or unsubstituted aryl group having from 6 to 33 carbon atoms; a substituted or unsubstituted heterocyclic ring having from 1 to 28 carbon atoms and one or more hetero atoms, such as N, O, and/or S; an alkyl, cycloalkyl, alkenyl, alkoxyalkyl, aryl, or phenoxy group connecting to a substituted or unsubstituted aromatic ring; or an alkyl, cycloalkyl, alkenyl, alkoxyalkyl, aryl, or phenoxy group connecting to a substituted or unsubstituted heterocyclic ring having 1 to 28 carbon atoms and one or more heteroatoms such as N, O, and/or S;

$R^2$ is a substituted or unsubstituted amine group having from 0 to 25 carbon atoms; a substituted or unsubstituted alkyl, alkenyl, or alkoxy group having from 1 to 28 carbon atoms; a substituted or unsubstituted cycloalkyl group from 3 to 28 carbon atoms; a substituted or unsubstituted acyloxy group having from 2 to 25 carbon atoms; a substituted or unsubstituted aryl group having from 6 to 33 carbon atoms; a substituted or unsubstituted heterocyclic ring having from 1 to 28 carbon atoms and one or more hetero atoms, such as N, O, and/or S; an alkyl, cycloalkyl, alkenyl, alkoxyalkyl, aryl, or phenoxy group connecting to a substituted or unsubstituted aromatic ring; or an alkyl, cycloalkyl, alkenyl, alkoxyalkyl, aryl, or phenoxy group connecting to a substituted or unsubstituted heterocyclic ring having 1 to 25 carbon atoms and one or more hetero atoms such as N, O, and/or S);

$R^3$ is a substituted or unsubstituted amine group having from 0 to 25 carbon atoms; a substituted or unsubstituted alkyl, alkoxy, or alkenyl group having from 1 to 28 carbon atoms; a substituted or unsubstituted cycloalkyl group having from 3 to 28 carbon atoms; a substituted or unsubstituted acyloxy group having from 2 to 25 carbon atoms; a substituted or unsubstituted aryl group having from 6 to 33 carbon atoms; a substituted or unsubstituted heterocyclic ring having from 1 to 28 carbon atoms and one or more hetero atoms, such as N, O, and/or S; an alkyl, cycloalkyl, alkenyl, alkoxyalkyl, aryl, or phenoxy group connecting to a substituted or unsubstituted aromatic ring; or an alkyl, cycloalkyl, alkoxyalkyl, aryl, or phenoxy group connecting to a substituted or unsubstituted heterocyclic ring having 1 to 25 carbon atoms and containing one or more hetero atoms such as N, O, and/or S; said $R^1$, $R^2$, and $R^3$ may further combine with each other to form a 5-, 6-, or 7-membered ring; and X is a moiety covalently bound to the ring and capable of being negatively charged, for example a chalcongen such as a sulfur atom or an oxygen atom.

Alternatively, the mesoionic compound is a tetrazolium compound having the structure (II)

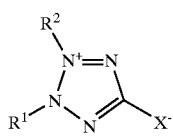

wherein $R^1$, $R^2$, and X are as defined above.

In another embodiment, a method for the manufacture of a coated article comprises contacting the surface of the article with the above-described coating composition, preferably at pH about 3 to about 11 and at an elevated temperature of about 40 to about 95° C. The method is particularly useful for coating the surface of an article of manufacture that is subject to exposure to corrosive conditions or one subject to sliding or rubbing contact with another surface under unusual wearing and bearing pressures.

Another embodiment comprises an article of manufacture having a surface and a coating deposited thereon, wherein the coating comprises about 95 to about 99.9 weight percent nickel and about 5 to about 0.1 weight percent boron or from about 85 to about 99 weight percent of nickel and about 15 to about 1 weight percent phosphorus.

DETAILED DESCRIPTION OF THE INVENTION

Figure 1:
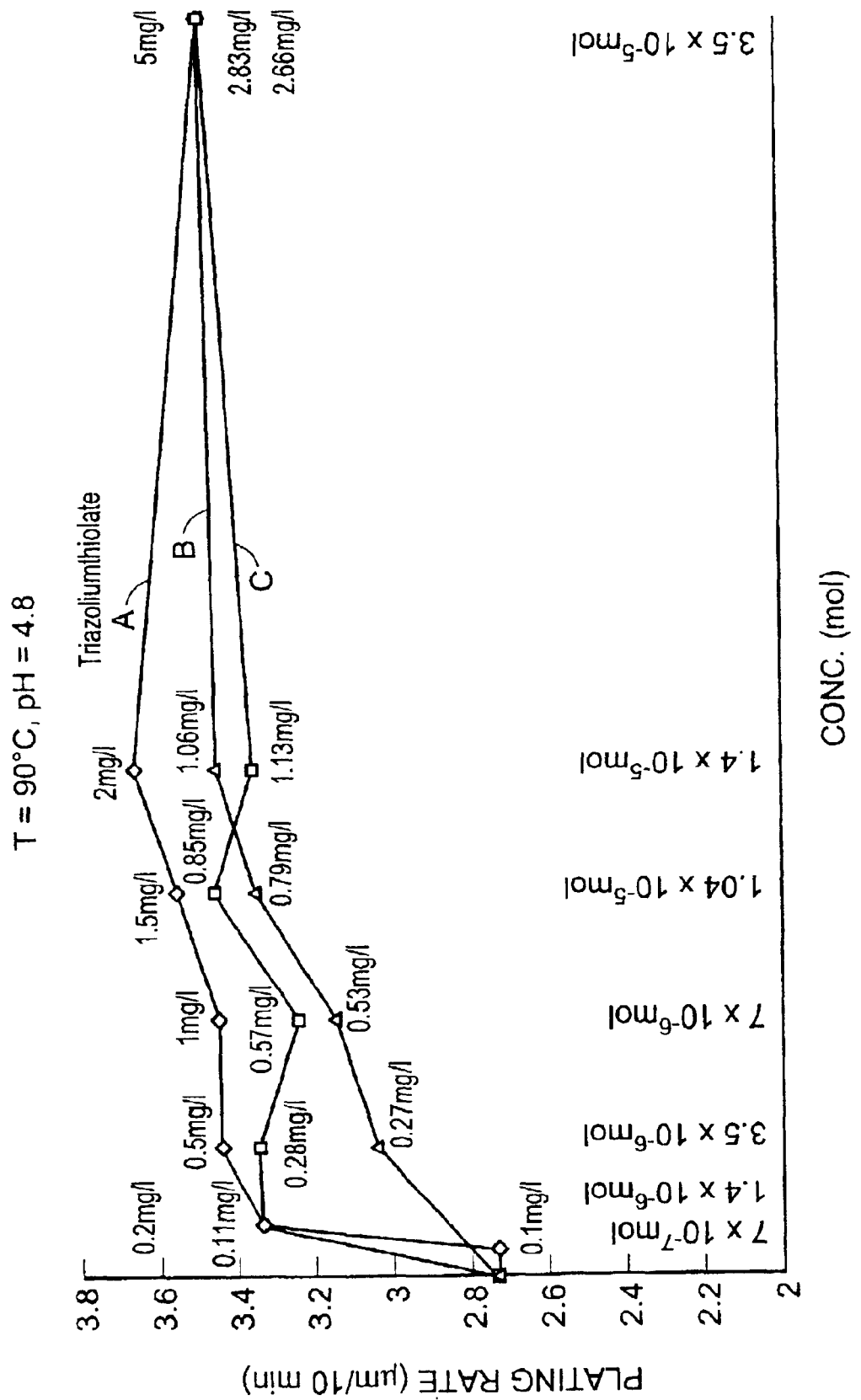
FIG. 1 is a graph showing a comparison of the plating rate (micrometers per 10 minutes) of equivalent concentrations of triazolium thiolate (A), thiourea (B), and sodium thiocyanate (C) at 90° C., pH 4.8.

An electroless nickel coating composition comprising nickel, a reducing agent, and a complexing agent may be improved by the addition of a mesoionic compound as a stabilizer, preferably in an amount from about 0.05 to about 10 milligrams per liter (mg/l). The mesoionic compound may comprise sulfur. Most preferably, the mesoionic compound is a 1,2,4-triazole having the structure (I):

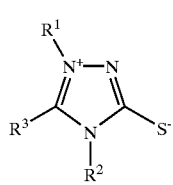

wherein $R^1$ is a substituted or unsubstituted alkyl groups having from 1 to 28, and preferably from 1 to 8 carbon atoms; an alkenyl group having from 1 to 28, and preferably from 1 to 8 carbon atoms; a substituted or unsubstituted cycloalkyl group having from 3 to 28 carbon atoms; a substituted or unsubstituted aryl group having from 6 to 33, and preferably from 6 to 12 carbon atoms; or a substituted or unsubstituted heterocyclic ring having from 1 to 28, and preferably from 1 to 14 carbon atoms and one or more hetero atoms, such as N, O, and/or S. Exemplary substitutions include but are not limited to an alkoxy group having from 1 to 6 carbon atoms, a thioalkoxy group having from 1 to 6 carbon atoms, an alkoxycarbonyl group having from 2 to 8 carbon atoms, a cyano group, a carboxyl group, an amino group, and a hydroxyl group. Exemplary alkyl groups include methyl, ethyl, propyl, butyl, 2-ethylhexyl, and the like; exemplary alkenyl groups include allyl; and exemplary cycloalkyl groups include substituted and unsubstituted cyclopentyl and cyclohexyl groups; exemplary aryl groups include phenyl, 4-methylenedioxyphenyl, 3-sulfamoylphenyl, and the like; exemplary heterocyclic rings are 4-pyridyl.

$R^1$ may further be an alkyl, cycloalkyl, alkenyl, alkoxyalkyl, aryl, or phenoxy group connecting to a substituted or unsubstituted aromatic ring such as phenyl or naphthyl; or an alkyl, cycloalkyl, alkenyl, alkoxyalkyl, aryl, or phenoxy group connecting to a substituted or unsubstituted heterocyclic ring containing one or more heteroatoms such as N, O, and/or S and having 1 to 25, and preferably 2 to 10 carbon atoms. Exemplary substitutions for the aromatic ring or heterocyclic ring include but are not limited to an alkoxy group having from 1 to 6 carbon atoms, a thioalkoxy group having from 1 to 6 carbon atoms, an alkoxycarbonyl group having from 2 to 8 carbon atoms, a cyano group, a carboxyl group, an amino group, and a hydroxyl group.

$R^2$ is a substituted or unsubstituted amine group having from 0 to 25 (preferably from 0 to 8) carbon atoms; a substituted or unsubstituted acyloxy group having from 2 to 25 (preferably from 2 to 8) carbon atoms; a substituted or unsubstituted alkoxy group having from 1 to 28, and preferably from 1 to 8 carbon atoms; a substituted or unsubstituted alkyl group having from 1 to 28, and preferably from 1 to 8 carbon atoms; a substituted or unsubstituted alkenyl group having from 1 to 28, and preferably from 1 to 8 carbon atoms; a substituted or unsubstituted cycloalkyl group having from 3 to 28 carbon atoms; a substituted or unsubstituted aryl group having from 6 to 33, and preferably from 6 to 12 carbon atoms; or a substituted or unsubstituted heterocyclic ring having from 1 to 28, and preferably from 1 to 14 carbon atoms and one or more hetero atoms, such as N, O, and/or S.

Exemplary substitutions for these groups include but are not limited to an alkoxy group having from 1 to 6 carbon atoms, a thioalkoxy group having from 1 to 6 carbon atoms, an alkoxycarbonyl group having from 2 to 8 carbon atoms, a cyano group, a carboxyl group, an amino group, a hydroxyl group, and combinations thereof. Exemplary amino groups include amino, methylamino, ethylamino, or 2-ethylhexylamino; exemplary acyloxy groups include acetoxy and benzoyloxy; exemplary alkoxy groups include methoxy; exemplary alkyl groups include methyl, ethyl, propyl, butyl, 2-ethylhexyl, and the like; exemplary alkenyl groups include allyl; and exemplary cycloalkyl groups include substituted and unsubstituted cyclopentyl and cyclohexyl groups; exemplary aryl groups include phenyl, 4-methylenedioxyphenyl, 3-sulfamoylphenyl, and the like; and exemplary heterocyclic rings are 4-pyridyl or 2-pyridyl.

$R^2$ may further be, for example, an alkyl, cycloalkyl, alkenyl, alkoxyalkyl, aryl, or phenoxy group connecting to a substituted or unsubstituted aromatic ring such as phenyl, naphthyl; or an alkyl, cycloalkyl, alkenyl, alkoxyalkyl, aryl, or phenoxy group connecting to a substituted or unsubstituted heterocyclic ring containing one or more heteroatoms such as N, O, and/or S and having 1 to 25, and preferably 2 to 10 carbon atoms. Exemplary substitutions for the aromatic ring or heterocyclic ring include but are not limited to an alkoxy group having from 1 to 6 carbon atoms, a thioalkoxy group having from 1 to 6 carbon atoms, an alkoxycarbonyl group having from 2 to 8 carbon atoms, a cyano group, a carboxyl group, an amino group, a hydroxyl group, (e.g., 2-(1',5'-dimethyl-1',2',4'-triazolium-3'-thiolate-4'-)ethyl), and combinations thereof.

$R^3$ is a substituted or unsubstituted amine group having from 0 to 25 (preferably from 0 to 8) carbon atoms; a substituted or unsubstituted acyloxy group having from 2 to 25 (preferably from 2 to 8) carbon atoms; a substituted or unsubstituted alkoxy group having from 1 to 28, and preferably from 1 to 8 carbon atoms; a substituted or unsubstituted alkyl group having from 1 to 28, and preferably from 1 to 8 carbon atoms; a substituted or unsubstituted alkenyl group having from 1 to 28, and preferably from 1 to 8 carbon atoms; a substituted or unsubstituted cycloalkyl group having from 3 to 28 carbon atoms; a substituted or unsubstituted aryl group having from 6 to 33, and preferably from 6 to 12 carbon atoms; or a substituted or unsubstituted heterocyclic ring having from 1 to 28, and preferably from 1 to 14 carbon atoms and one or more hetero atoms, such as N, O, and/or S.

Exemplary substitutions for these groups include but are not limited to an alkoxy group having from 1 to 6 carbon atoms, a thioalkoxy group having from 1 to 6 carbon atoms, an alkoxycarbonyl group having from 2 to 8 carbon atoms, a cyano group, a carboxyl group, an amino group, a hydroxyl group, and combinations thereof. Exemplary amino groups include amino, methylamino, ethylamino, or 2-ethylhexylamino; exemplary acyloxy groups include acetoxy and benzoyloxy; exemplary alkoxy groups include methoxy; exemplary alkyl groups include methyl, ethyl, propyl, butyl, 2-ethylhexyl, and the like; exemplary alkenyl groups include allyl; and exemplary cycloalkyl groups include substituted and unsubstituted cyclopentyl and cyclohexyl groups; exemplary aryl groups include phenyl, 4-methylenedioxyphenyl, 3-sulfamoylphenyl, and the like; and exemplary heterocyclic rings are 4-pyridyl or 2-pyridyl.

$R^3$ may further be, for example, an alkyl, cycloalkyl, alkenyl, alkoxyalkyl, aryl, or phenoxy group connecting to a substituted or unsubstituted aromatic ring such as phenyl or naphthyl; or an alkyl, cycloalkyl, alkenyl, alkoxyalkyl, aryl, or phenoxy group connecting to a substituted or unsubstituted heterocyclic ring containing one or more heteroatoms such as N, O, and/or S, and having 1 to 25, and preferably 2 to 10 carbon atoms. Exemplary substitutions for the aromatic ring or heterocyclic ring include but are not limited to an alkoxy group having from 1 to 6 carbon atoms, a thioalkoxy group having from 1 to 6 carbon atoms, an alkoxycarbonyl group having from 2 to 8 carbon atoms, a cyano group, a carboxyl group, an amino group, a hydroxyl group, and combinations thereof.

$R^1$, $R^2$, and $R^3$ may further combine with each other to form a 5-, 6-, or 7-membered ring.

X is a moiety covalently bound to the ring and capable of being negatively charged, for example a chalcongen such as a sulfur atom, selenium atom, or oxygen atom. Sulfur and oxygen are preferred.

Alternatively, the mesoionic compound is a tetrazolium compound having the structure (II)

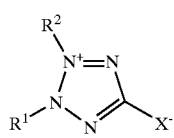

(II)

wherein $R^1$, $R^2$, and X are as defined above.

Other mesoionic compounds containing oxygen, nitrogen, and/or sulfur may also be used, including sydnones. One example of a suitable sydnone has the structure (III):

(III)

wherein $R^1$ is as describe above.

The amount of mesoionic compound is readily determined by those of ordinary skill in the art, and depends on the nature of the other components, the amounts of other components, the temperature at which the solution is plated, the article to be plated, and the like. In general, effective concentrations of the mesoionic compound will be about 0.05 to about 10, preferably about 0.5 to about 4 mg/l.

The nickel component of the electroless nickel coating composition may be derived from soluble nickel containing salts. The anion component of the salt preferably is not antagonistic to the coating process. For example salts of oxidizing acids such as chlorate salts are not desirable since they may react with the reducing agent in the bath. Nickel chlorides, sulfates, formates, acetates, and other salts whose anions are substantially inert with respect to the other ingredients in the coating bath are satisfactory. Nickel sulfate and nickel chloride are typically used.

Other metal ions may be provided by the addition to the solution of the respective water-soluble salts. Again, salts of those metals having an anion component, which is not antagonistic to the coating process, are generally suitable, for example metal sulfates, formates, acetates, and other salts whose anions are substantially inert with respect to the other ingredients in the coating bath.

Examples of suitable reducing agents include hypophosphorous acid, hypophosphites such as sodium hypophosphite, borohydrides, dimethylamine borane, trimethylamine borane, hydrazine, thiosulfates, and ascorbates, any of which may be blended as a reducing agent. Exemplary thiosulfates are ammonium thiosulfate, sodium thiosulfate, and potassium thiosulfate.

The borohydride reducing agent can be selected from among the known borohydrides having a good degree of water solubility and stability in aqueous solutions. Sodium borohydride is preferred. In addition, substituted borohydrides in which not more than three of the hydrogen atoms of the borohydride ion have been replaced can be utilized. Sodium trimethoxyborohydride ($NaB(OCH_3)_3H$) and potassium trimethoxyborohydride ($KB(OCH_3)_3H$) are illustrative.

The complexing or sequestering agent is used to limit or prevent precipitation of the nickel and any other metal ions. The metal ion complexing agent may also function to lower metal ion reactivity, as the complexed or sequestered metal ions have minimal reactivity with the reducing agent in the bulk solution but do react at the catalytic surfaces of substrates in contact with the solution.

Suitable complexing agents include, for example, ammonia and organic complex-forming agents containing one or more of the following functional groups: primary amino, secondary amino, tertiary amino, imino, carboxy and hydroxy. Many metal ion complexing agents are known in the art, for example ethylenediamine, diethylene triamine, triethylene tetramine, triethylenetriamine, organic acids such as malic acid, succinic acid, lactic acid, oxalic acid, citric acid, tartaric acid and ethylene diamine tetraacetic acid, and the water soluble salts thereof, and amino acids such as glycine, alanine, iminodiacetic acid, alginine, and glutamic acid.

Other known stabilizing agents may optionally be used. Exemplary stabilizers are water-soluble lead salts such as lead acetate and sulfur compounds such as thiodiglycolic acid.

The quantities of each of the above components in an electroless nickel coating composition are readily determined by those of ordinary skill in the art, and depend, for example, on the desired characteristics of the deposited coating, the desired rate of coating, the nature of the components, the relative amounts of the components, the temperature at which the solution is coated, the article to be coated, the catalytic species, and the like. In general, effective concentrations of nickel ions will be about 0.01 to about 1 mol/liter, more preferably about 0.05 to about 0.2 mol/liter. In general, effective concentrations of the reducing agent will be about 0.01 to about 1 mol/liter, more preferably about 0.05 to about 0.5 mol/liter. In general, effective concentrations of the metal ion complexing agent will be about 0.01 to 2 mol/liter, more preferably about 0.05 to about 1 mol/liter. The optional accelerator is preferably used in an amount of about 0.5 to about 4 mg/liter.

Other characteristics of the plating composition, for example pH, may be adjusted according to need, and depending on the particular components. The electroless nickel plating solution may generally be at a pH of about 3 to about 11, and the pH is generally adjusted during plating, since the bath may become acidic due to the liberation of protons. Adjustment of solution pH can be accomplished by addition of any of a wide variety of mineral acids or solutions thereof, or ammonia.

The plating composition is typically prepared by forming an aqueous solution of the appropriate amounts of metal salts, adding the complexing agent(s) and stabilizer, adjusting the pH if needed, filtering and then, immediately before introducing the substrate into the solution, adding the required amounts of reducing agent. The plating composition may also be formed by the addition of concentrates as is known in the art.

The present invention provides a method of depositing a nickel layer on a substrate comprising the step of contacting the substrate with the above described composition. Suitable substrates for electroless deposition are those with a catalytically active surface, including those composed of nickel, cobalt, iron, steel, aluminum, zinc, palladium, platinum, copper, brass, chromium, tungsten, titanium, tin, silver carbon, graphite and alloys comprising at least one of the foregoing metals. These materials function catalytically to cause a reduction of the metal ions in the plating bath by the reducing agent and thereby result in deposition of the metal alloy on the surface of the substrate in contact with the plating bath. Non-catalytic metals can be used insofar as they are subject to galvanic initiation by applying electricity to the article until reducing deposition is initiated. Alternatively, electroless plating is carried out on a non-catalytic metal article after a coating of a catalytic metal as mentioned above is previously plated thereon. Non-metallic substrates such as glass, ceramics, and plastics are generally non-catalytic. However, such substances can be rendered catalytically active by producing a film of one of the catalytic materials on its surface. This can be accomplished by a variety of techniques known to those of ordinary skill in the art. One preferred procedure involves dipping a surface of a glass, ceramic, or plastic article in a solution of stannous chloride and then contacting the treated surface with a solution of palladium chloride. A thin layer of palladium is thereby deposited in reduced form on the treated surface. The article can then be plated or coated with the nickel composition by contact with a coating bath as detailed below.

The article to be coated or plated may be prepared by mechanical cleaning, degreasing, anode-alkaline cleaning, and then pickling in an acid bath in accordance with the standard practice in the metal-plating art. The substrate can be masked if necessary to allow deposition of the metal alloy coating only on selected surfaces. Although the present coatings in general exhibit excellent adhesion to properly prepared substrate surfaces, in instances where coating adhesion is critical or where some adhesion problems are experienced, adhesion of the coating can often be enhanced by depositing a nickel strike electrochemically on the substrate surface prior to applying the present solution.

Electroless coating processes are well known in the art, such processes being disclosed generally in U.S. Pat. Nos. 5,109,613; 3,338,726; 3,096,182; 3,045,334; 3,378,400; and 2,658,841, the entire contents of which are hereby incorporated by reference. In a typical procedure, the cleaned or otherwise surface-prepared article is immersed in the hot (about 40 to about 95° C.) plating composition to initiate the coating process. Coating is continued until deposition of the coating has progressed to the desired thickness or until the metal ions are depleted from solution. Deposition rates will vary under the present conditions, generally from about 0.1 mil (0.001 inch, 25 micrometers) to about 1.5 mil per hour. The preferred plating rate is about 1 mil per hour.

Figure 2:
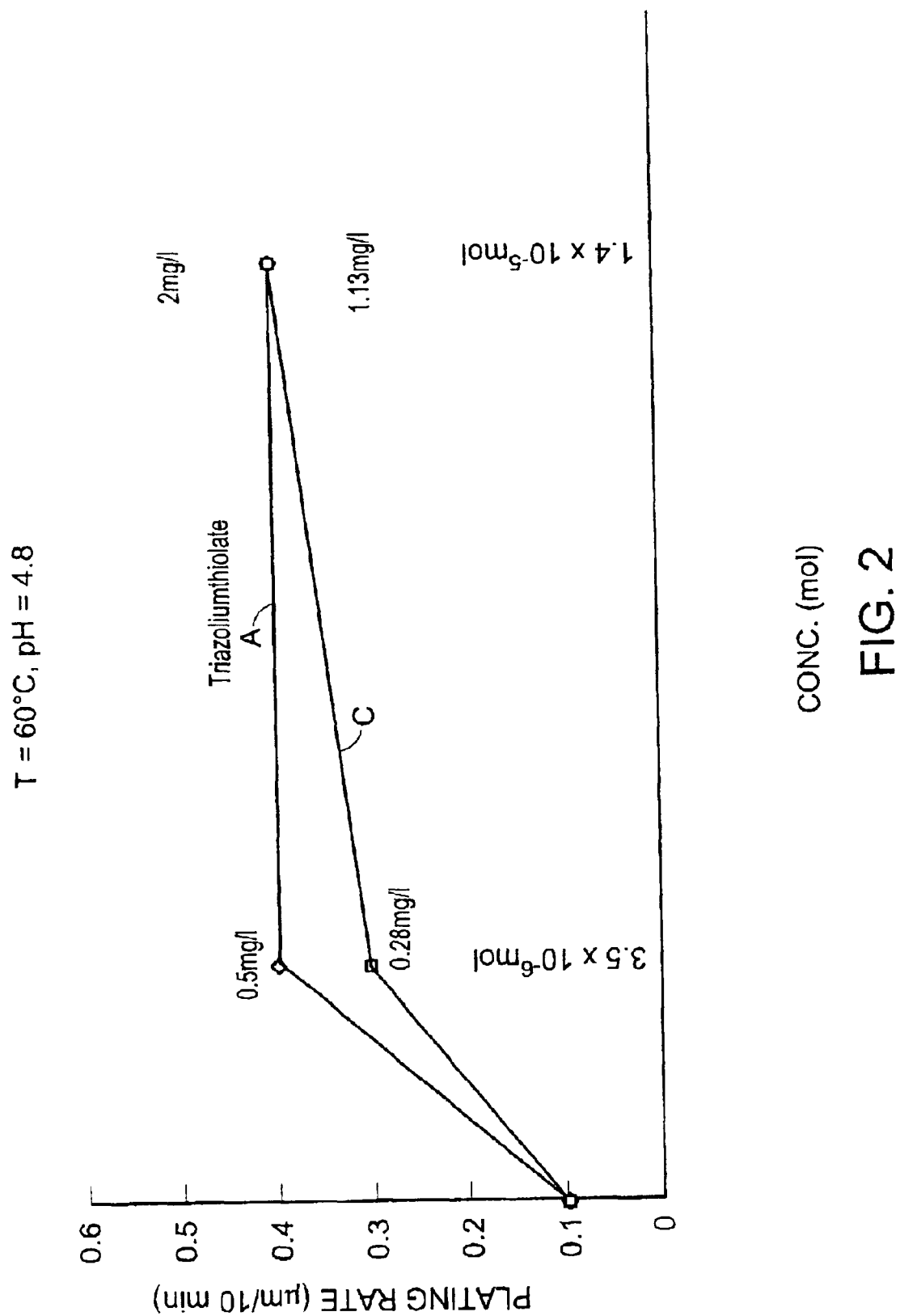
FIG. 2 is a graph showing a comparison of the plating rate (micrometers per 10 minutes) of equivalent concentrations of triazolium thiolate (A), and sodium thiocyanate (C) at 60° C., pH 4.8.

FIG. 1 is a graph showing a comparison of the plating rate (micrometers per 10 minutes) of equivalent concentrations of triazolium thiolate (A), thiourea (B), and sodium thiocyanate (C) at 90° C., pH 4.8. FIG. 2 is a graph showing a comparison of the plating rate (micrometers per 10 minutes) of equivalent concentrations of triazolium thiolate (A), and sodium thiocyanate (C) at 60° C., pH 4.8. From these graphs, it can be seen that the electroless nickel plating solutions comprising a mesoionic stabilizer have enhanced plating rates compared to thiourea or sodium thiocyanate stabilizers where equivalent quantities are used. In addition, it can be seen that only a minimum quantity is required to be effective, and from that point forward the plating rate is relatively constant (irrespective of the concentration). Use of mesoionic compounds therefore makes it easier to maintain (or control) the plating solution.

The electroless nickel coatings exhibit excellent hardness and concomitant wear resistance. They are highly ductile, allowing the coating to flex with the substrate while maintaining a strong bond to the coated material. The coatings appear to be amorphous, and nonporous.

The electroless nickel coatings have a wide range of applications. They have particular utility for coating surfaces of articles that under normal use are subjected to highly abrasive, rubbing, or sliding conditions under high temperatures/pressures. Such high wear conditions are found at many points in construction of tools, internal combustion engines including gas turbine engines, transmissions and in a wide variety of heavy equipment construction applications.

The invention is further illustrated by the following non-limiting example, which and are not in any way to be taken as limiting the scope thereof.

An electroless nickel plating solution was made, using 12 g/l of malic acid, 24 g/l of lactic acid, 12 g/l of acetic acid, 1.8 g/l of sodium tetraborate, 30 g/l of sodium hypophosphite, 1 mg/l of a lead salt, 2 mg/l of 1,4,5-trimethyl-1,2,4-triazolium-3-thiolate, and 25 mg/l of EDTA in 1 l of water. The pH was adjusted to 4.8, and a substrate was plated at 90° C. at a plating rate of 21.6 micrometers per hour.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments within the scope of the disclosure.

What is claimed is:

1. An electroless nickel plating composition comprising nickel, a reducing agent, a complexing agent, and an accelerator, wherein the accelerator is a mesoionic compound in an amount sufficient to accelerate the rate of deposition of the composition.

2. The composition of claim 1 wherein the mesoionic compound comprises sulfur.

3. The composition of claim 1 wherein the mesoionic compound is selected from the group consisting of a triazolium compound having the structure (I):

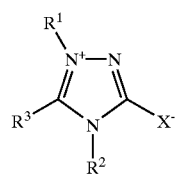

and a tetrazolium compound having the structure (II)

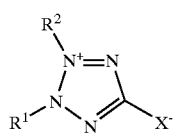

wherein
$R^1$ is a substituted or unsubstituted alkyl, alkenyl, thioalkoxy, or alkoxycarbonyl group having from 1 to 28 carbon atoms; a substituted or unsubstituted cycloalkyl group having from 3 to 28 carbon atoms; a substituted or unsubstituted aryl group having from 6 to 33 carbon atoms; a substituted or unsubstituted heterocyclic ring having from 1 to 28 carbon atoms and one or more hetero atoms; an alkyl, cycloalkyl, alkenyl, alkoxyalkyl, aryl, or phenoxy group connecting to a substituted or unsubstituted aromatic ring; or an alkyl, cycloalkyl, alkenyl, alkoxyalkyl, aryl, or phenoxy group connecting to a substituted or unsubstituted heterocyclic ring having 1 to 28 carbon atoms and one or more heteroatoms;
$R^2$ is a substituted or unsubstituted amine group having from 0 to 25 carbon atoms; a substituted or unsubstituted alkyl, alkenyl, or alkoxy group having from 1 to 28 carbon atoms; a substituted or unsubstituted cycloalkyl group from 3 to 28 carbon atoms; a substituted or unsubstituted acyloxy group having from 2 to 25 carbon atoms; a substituted or unsubstituted aryl group having from 6 to 33 carbon atoms; a substituted or unsubstituted heterocyclic ring having from 1 to 28 carbon atoms and one or more hetero atoms; an alkyl, cycloalkyl, alkenyl, alkoxyalkyl, aryl, or phenoxy group connecting to a substituted or unsubstituted aromatic ring; or an alkyl, cycloalkyl, alkenyl, alkoxyalkyl, aryl, or phenoxy group connecting to a substituted or unsubstituted heterocyclic ring having 1 to 25 carbon atoms and one or more hetero atoms;
$R^3$ is a substituted or unsubstituted amine group having from 0 to 25 carbon atoms; a substituted or unsubstituted alkyl, alkoxy, or alkenyl group having from 1 to 28 carbon atoms; a substituted or unsubstituted cycloalkyl group having from 3 to 28 carbon atoms; a substituted or unsubstituted acyloxy group having from 2 to 25 carbon atoms; a substituted or unsubstituted aryl group having from 6 to 33 carbon atoms; a substituted or unsubstituted heterocyclic ring having from 1 to 28 carbon atoms and one or more hetero atoms; an alkyl, cycloalkyl, alkenyl, alkoxyalkyl, aryl, or phenoxy group connecting to a substituted or unsubstituted aromatic ring; or an alkyl, cycloalkyl, alkenyl, alkoxyalkyl, aryl, or phenoxy group connecting to a substituted or unsubstituted heterocyclic ring having 1 to 25 carbon atoms and containing one or more hetero atoms; said $R^1$, $R^2$, and $R^3$ may further combine with each other to form a 5-, 6-, or 7-membered ring; and
X is a moiety covalently bound to the ring and capable of being negatively charged.

4. The composition of claim 3 wherein X is a sulfur or an oxygen atom.

5. The composition of claim 1 wherein the mesoionic compound is a sydnone compound.

6. The composition of claim 5 wherein the sydnone compound has the following structure (III):

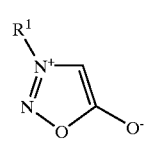

wherein $R^1$ is a substituted or unsubstituted alkyl, alkenyl, thioalkoxy, or alkoxycarbonyl group having from 1 to 28 carbon atoms; a substituted or unsubstituted cycloalkyl group having from 3 to 28 carbon atoms; a substituted or unsubstituted aryl group having from 6 to 33 carbon atoms; a substituted or unsubstituted heterocyclic ring having from 1 to 28 carbon atoms and one or more hetero atoms; an alkyl, cycloalkyl, alkenyl, alkoxyalkyl, aryl, or phenoxy group connecting to a substituted or unsubstituted aromatic ring; or an alkyl, cycloalkyl, alkenyl, alkoxyalkyl, aryl, or phenoxy group connecting to a substituted or unsubstituted heterocyclic ring having 1 to 28 carbon atoms and one or more heteroatoms.

7. The composition of claim 1 having a pH of about 3 to about 11.

8. The composition of claim 1 wherein the mesoionic compound is present in a concentration of about 0.05 to about 10 mg/l.

9. The composition of claim 1 wherein the nickel is derived from a soluble nickel salt.

10. The composition of claim 9 wherein the soluble nickel salt is selected from the group consisting of nickel chloride, nickel sulfate, nickel formate, and nickel acetate.

11. The composition of claim 1 wherein the reducing agent is selected from the group consisting of hypophosphorous acid, hypophosphites, borohydrides, dimethylamine borane, trimethylamine borane, hydrazine, thiosulfates, and ascorbates.

12. The composition of claim 1 wherein the complexing agent is selected from the group consisting of ammonia and organic complex-forming agents containing one or more functional groups selected from the group consisting of primary amino, secondary amino, tertiary amino, imino, carboxy and hydroxy.

13. The composition of claim 12 wherein the complexing agent is selected from the group consisting of ethylenediamine, diethylene triamine, triethylene tetramine, triethylenetriamine, organic acids, water soluble salts of organic acids, and amino acids.

14. The composition of claim 13 wherein the organic acids are selected from the group consisting of malic acid, succinic acid, lactic acid, oxalic acid, citric acid, tartaric acid, and ethylene diaminetetraacetic acid.

15. The composition of claim 1 having an effective concentration of nickel ions of 0.01 to 1 mol/l.

16. The composition of claim 1 having an effective concentration of reducing agent of 0.01 to 1 mol/l.

17. The composition of claim 1 having an effective concentration of complexing agent of 0.01 to 2 mol/l.

18. A method of depositing an electroless nickel layer on a substrate comprising contacting the substrate with the composition of claim 1.

19. An electroless nickel plating composition comprising:
nickel;
a reducing agent selected from the group consisting of hypophosphorous acid, hypophosphites, borohydrides, dimethylamine borane, trimethylamine borane, hydrazine, thiosulfates, and ascorbates;
a complexing agent selected from the group consisting of ammonia and organic complex-forming agents containing one or more functional groups selected from the group consisting of primary amino, secondary amino, tertiary amino, imino, carboxy and hydroxy; and
a mesoionic compound of formula (I), (II), or (III):

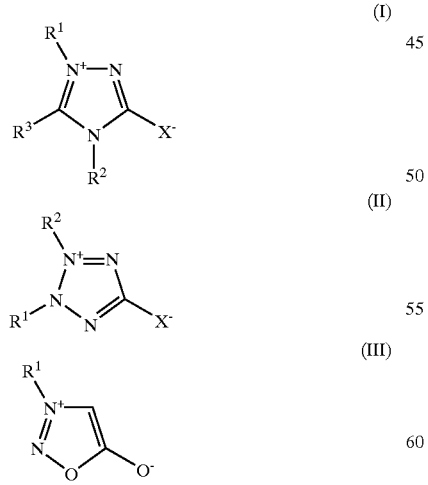

wherein $R^1$ is a substituted or unsubstituted alkyl, alkenyl, thioalkoxy, or alkoxycarbonyl group having from 1 to 28 carbon atoms; a substituted or unsubstituted cycloalkyl group having from 3 to 28 carbon atoms; a substituted or unsubstituted aryl group having from 6 to 33 carbon atoms; a substituted or unsubstituted heterocyclic ring having from 1 to 28 carbon atoms and one or more hetero atoms; an alkyl, cycloalkyl, alkenyl, alkoxyalkyl, aryl, or phenoxy group connecting to a substituted or unsubstituted aromatic ring; or an alkyl, cycloalkyl, alkenyl, alkoxyalkyl, aryl, or phenoxy group connecting to a substituted or unsubstituted heterocyclic ring having 1 to 28 carbon atoms and one or more heteroatoms;

$R^2$ is a substituted or unsubstituted amine group having from 0 to 25 carbon atoms; a substituted or unsubstituted alkyl, alkenyl, or alkoxy group having from 1 to 28 carbon atoms; a substituted or unsubstituted cycloalkyl group from 3 to 28 carbon atoms; a substituted or unsubstituted acyloxy group having from 2 to 25 carbon atoms; a substituted or unsubstituted aryl group having from 6 to 33 carbon atoms; a substituted or unsubstituted heterocyclic ring having from 1 to 28 carbon atoms and one or more hetero atoms; an alkyl, cycloalkyl, alkenyl, alkoxyalkyl, aryl, or phenoxy group connecting to a substituted or unsubstituted aromatic ring; or an alkyl, cycloalkyl, alkenyl, alkoxyalkyl, aryl, or phenoxy group connecting to a substituted or unsubstituted heterocyclic ring having 1 to 25 carbon atoms and one or more hetero atoms;

$R^3$ is a substituted or unsubstituted amine group having from 0 to 25 carbon atoms; a substituted or unsubstituted alkyl, alkoxy, or alkenyl group having from 1 to 28 carbon atoms; a substituted or unsubstituted cycloalkyl group having from 3 to 28 carbon atoms; a substituted or unsubstituted acyloxy group having from 2 to 25 carbon atoms; a substituted or unsubstituted aryl group having from 6 to 33 carbon atoms; a substituted or unsubstituted heterocyclic ring having from 1 to 28 carbon atoms and one or more hetero atoms; an alkyl, cycloalkyl, alkenyl, alkoxyalkyl, aryl, or phenoxy group connecting to a substituted or unsubstituted aromatic ring; or an alkyl, cycloalkyl, alkoxyalkyl, aryl, or phenoxy group connecting to a substituted or unsubstituted heterocyclic ring having 1 to 25 carbon atoms and containing one or more hetero atoms; said $R^1$, $R^2$, and $R^3$ may further combine with each other to form a 5-, 6-, or 7-membered ring; and X is a moiety covalently bound to the ring and capable of being negatively charged.

20. A method of depositing an electroless nickel layer on a substrate comprising contacting the substrate with the composition of claim 19.

* * * * *